United States Patent
Guo

(10) Patent No.: US 9,310,486 B2
(45) Date of Patent: Apr. 12, 2016

(54) METHOD AND APPARATUS FOR TERMINAL TO DETERMINE APPROACH OF OBJECT

(71) Applicant: Huawei Device Co., Ltd., Shenzhen, Guangdong (CN)

(72) Inventor: Lei Guo, Shenzhen (CN)

(73) Assignee: Huawei Device Co., Ltd., Shenzhen (CN)

(*) Notice: Subject to any disclaimer, the term of this patent is extended or adjusted under 35 U.S.C. 154(b) by 186 days.

(21) Appl. No.: 14/139,006

(22) Filed: Dec. 23, 2013

(65) Prior Publication Data

US 2014/0113686 A1 Apr. 24, 2014

Related U.S. Application Data

(63) Continuation of application No. PCT/CN2011/076321, filed on Jun. 24, 2011.

(51) Int. Cl.
*H04B 1/38* (2015.01)
*G01S 17/02* (2006.01)
(Continued)

(52) U.S. Cl.
CPC ............ *G01S 17/026* (2013.01); *H03K 17/941* (2013.01); *H03K 17/9631* (2013.01); *H03K 17/9636* (2013.01); *H04M 1/026* (2013.01); *H03K 2217/94026* (2013.01); *H03K 2217/94108* (2013.01); *H03K 2217/94116* (2013.01)

(58) Field of Classification Search
CPC ..... G06F 1/1628; G06F 3/044; G01S 17/026; H03K 17/941; H03K 17/9631; H03K 17/9636; H03K 2217/94026; H03K 2217/94108; H03K 2217/94116; H04M 1/026

USPC ........ 455/566, 41.1, 41.2, 41.3, 550.1, 556.1, 455/556.2, 572, 575.1; 345/173, 156, 169, 345/170; 340/686.6; 257/428
See application file for complete search history.

(56) References Cited

U.S. PATENT DOCUMENTS

2007/0085157 A1 4/2007 Fadell et al.
2007/0182717 A1 8/2007 Arnold
(Continued)

FOREIGN PATENT DOCUMENTS

CN 101558372 A 10/2009
CN 201374735 Y 12/2009
(Continued)

*Primary Examiner* — Shaima Q Aminzay
(74) *Attorney, Agent, or Firm* — Leydig, Voit & Mayer, Ltd.

(57) ABSTRACT

Embodiments of the present invention provide a method and an apparatus for a terminal to determine whether an object is approaching, wherein the method includes: reading, by an infrared receiver, a first infrared intensity value when an infrared emitting diode does not work, and reading, by the infrared receiver, a second infrared intensity value when the infrared emitting diode works; obtaining a first difference value between the second infrared intensity value and the first infrared intensity value as an intensity value of a reflected infrared ray; determining whether a second difference value between the intensity value of the reflected infrared ray and an infrared intensity threshold is greater than a preset second threshold; and determining that an object is approaching the terminal when the second difference value is greater than the preset second threshold value. The present invention enables each terminal to accurately determine whether there is an object approaching.

4 Claims, 4 Drawing Sheets

(51) Int. Cl.
*H03K 17/96* (2006.01)
*H04M 1/02* (2006.01)
*H03K 17/94* (2006.01)

(56) References Cited

U.S. PATENT DOCUMENTS

2008/0006762 A1* 1/2008 Fadell .................... G01J 1/4204
   250/201.1
2009/0121889 A1 5/2009 Lin et al.
2009/0159900 A1* 6/2009 Basoor ................. G01S 7/4813
   257/82
2010/0171027 A1 7/2010 Yun
2010/0297946 A1* 11/2010 Alameh .............. H04M 1/7253
   455/41.3
2011/0006907 A1 1/2011 Rothenberger
2011/0121181 A1* 5/2011 Costello ................ G01S 7/4813
   250/338.1

FOREIGN PATENT DOCUMENTS

| | | |
|---|---|---|
| CN | 101776772 A | 7/2010 |
| CN | 101855512 A | 10/2010 |
| EP | 1744241 A1 | 1/2007 |
| FR | 2561049 A1 | 9/1985 |

* cited by examiner

METHOD AND APPARATUS FOR TERMINAL TO DETERMINE APPROACH OF OBJECT

CROSS-REFERENCE TO RELATED APPLICATIONS

This application is a continuation of International Patent Application No. PCT/CN2011/076321, filed on Jun. 24, 2011, which is hereby incorporated by reference in its entirety.

TECHNICAL FIELD

The present invention relates to the field of communications, and in particular, to a method and an apparatus for a terminal to determine the approach of an object.

BACKGROUND

Currently, in various mobile phones, proximity optical sensors are widely applied to determine whether an object is approaching a mobile phone. A principle of the proximity optical sensor is that, an emitter emits an infrared ray, and receives an infrared ray reflected to a receiver end, and then determines, according to the intensity of the received infrared ray, whether there is an object approaching the mobile phone.

There is a proximity optical sensor formed of an infrared emitting diode and an infrared receiver in a mobile phone, where the infrared emitting diode emits an infrared ray. If there is an object reflecting back the emitted infrared ray, the reflected infrared ray is then received by the infrared receiver after being blocked by a physical structure such as a screen of the mobile phone. When the infrared emitting diode in the mobile phone works, the mobile phone receives an infrared ray in real time through the infrared receiver, and obtains an intensity value of a reflected infrared ray from the received infrared ray, and if the intensity value of the reflected infrared ray exceeds a preset threshold, it is determined that an object is approaching the mobile phone.

In a process of implementing the present invention, the inventor finds that the prior art has at least the following problem:

The infrared ray received by the infrared receiver is blocked by the physical structure such as the screen of the mobile phone; therefore, an impact generated because of the physical structure of the mobile phone exists in the obtained intensity value of the reflected infrared ray. However, an impact generated by each mobile phone is different, and if a same threshold is set for each mobile phone, some mobile phones will fail to accurately determine whether there is an object approaching.

SUMMARY

In order to enable each terminal to accurately determine whether an object is approaching, embodiments of the present invention provide a method and an apparatus for a terminal to determine the approach of an object. Technical solutions are as follows:

A method for a terminal to determine whether an object is approaching is provided, wherein the method includes: reading, by an infrared receiver, a first infrared intensity value when an infrared emitting diode does not work, and reading, by the infrared receiver, a second infrared intensity value when the infrared emitting diode works; obtaining a first difference value between the second infrared intensity value and the first infrared intensity value as an intensity value of a reflected infrared ray; determining whether a second difference value between the intensity value of the reflected infrared ray and an infrared intensity threshold that is stored by the terminal itself is greater than a preset second threshold; and when the second difference value is greater than the preset second threshold, determining that there is the object approaching the terminal.

A method for a terminal to determine whether an object is approaching is provided, wherein the method includes: when an infrared emitting diode of the terminal is activated, receiving an infrared ray from outside, and reading and caching an intensity value of the received infrared ray; when an infrared ray is received from the outside again, reading an intensity value of the received infrared ray, and calculating a difference value between the intensity value of the received infrared ray and the cached intensity value of the infrared ray; and when the calculated difference value is greater than a preset second threshold, determining that there is the object approaching the terminal.

An apparatus for a terminal to determine whether an object is approaching is provided, wherein the apparatus includes: an infrared receiver, configured to read a first infrared intensity value when an infrared emitting diode does not work, and read a second infrared intensity value when the infrared emitting diode works; an obtaining module, configured to obtain a first difference value between the second infrared intensity value and the first infrared intensity value as an intensity value of a reflected infrared ray; a judging module, configured to determine whether a second difference value between the intensity value of the reflected infrared ray and an infrared intensity threshold that is stored by the terminal itself is greater than a preset second threshold; and a first determining module, configured to, when the second difference value is greater than the preset second threshold, determine that there is the object approaching the terminal.

An apparatus for a terminal to determine whether an object is approaching is provided, wherein the apparatus includes: a reading module, configured to, when an infrared emitting diode of the terminal is activated, receive an infrared ray from outside, and read and cache an intensity value of the received infrared ray; a calculating module, configured to, when an infrared ray is received from the outside again, read an intensity value of the received infrared ray, and calculate a difference value between the intensity value of the received infrared ray and the cached intensity value of the infrared ray; and a second determining module, configured to, when the calculated difference value is greater than a preset second threshold, determine that there is the object approaching the terminal.

In the present invention, the intensity value of the reflected infrared ray is obtained, and whether the second difference value between the obtained intensity value of the reflected infrared ray and the infrared intensity threshold that is stored by the terminal itself is greater than a preset second threshold is determined. When the second difference value is greater than the preset second threshold, it is determined that there is an object approaching the terminal. When the second difference value between the obtained intensity value of the reflected infrared ray and the infrared intensity threshold that is stored by the terminal itself is compared to the preset second threshold, an impact generated by a physical structure of the terminal may be eliminated, and in this way, a same second threshold may be set for each terminal, so that each terminal can accurately determine whether there is an object approaching.

DESCRIPTION OF EMBODIMENTS

To make the objectives, technical solutions, and advantages of the present invention more comprehensible, the following further describes the embodiments of the present invention in detail with reference to the accompanying drawings.

Embodiment 1

Figure 1:
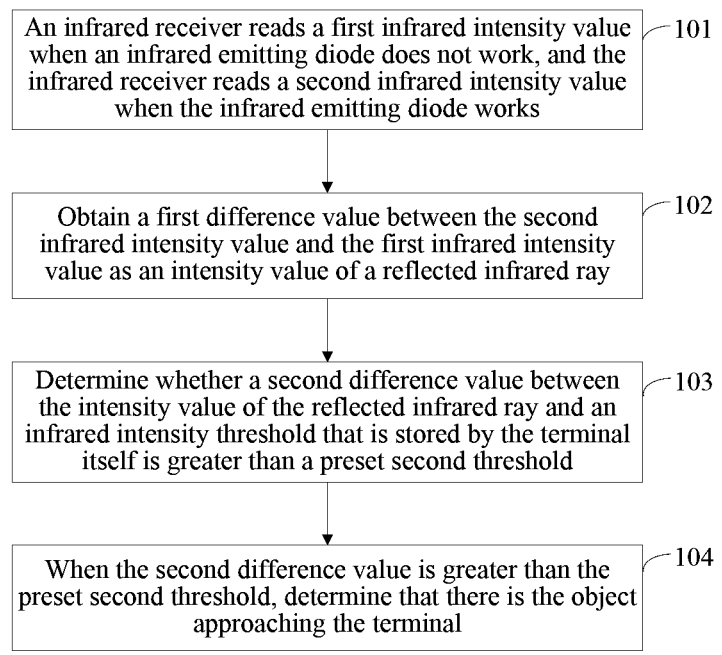
FIG. 1 is a flowchart of a method for a terminal to determine the approach of an object according to Embodiment 1 of the present invention.

As shown in FIG. 1, an embodiment of the present invention provides a method for a terminal to determine whether an object is approaching, where the method includes:

Step 101: An infrared receiver reads a first infrared intensity value when an infrared emitting diode does not work, and the infrared receiver reads a second infrared intensity value when the infrared emitting diode works.

Step 102: A first difference value between the second infrared intensity value and the first infrared intensity value is obtained as an intensity value of a reflected infrared ray.

Step 103: A second difference value between the intensity value of the reflected infrared ray and an infrared intensity threshold that is stored by the terminal itself is compared to a preset second threshold.

Step 104: When the second difference value is greater than the preset second threshold, it is determined that there is the object approaching the terminal.

In this embodiment of the present invention, the intensity value of the reflected infrared ray is obtained, and whether the second difference value between the obtained intensity value of the reflected infrared ray and the infrared intensity threshold that is stored by the terminal itself is greater than the preset second threshold is determined, and when the second difference value is greater than the preset second threshold, it is determined that there is the object approaching the terminal. When whether the second difference value between the obtained intensity value of the reflected infrared ray and the infrared intensity threshold that is stored by the terminal itself is greater than the preset second threshold is determined, an impact generated by a physical structure of the terminal may be eliminated, and in this way, a same second threshold may be set for each terminal, so that each terminal can accurately determine whether there is an object approaching.

Embodiment 2

Figure 2:
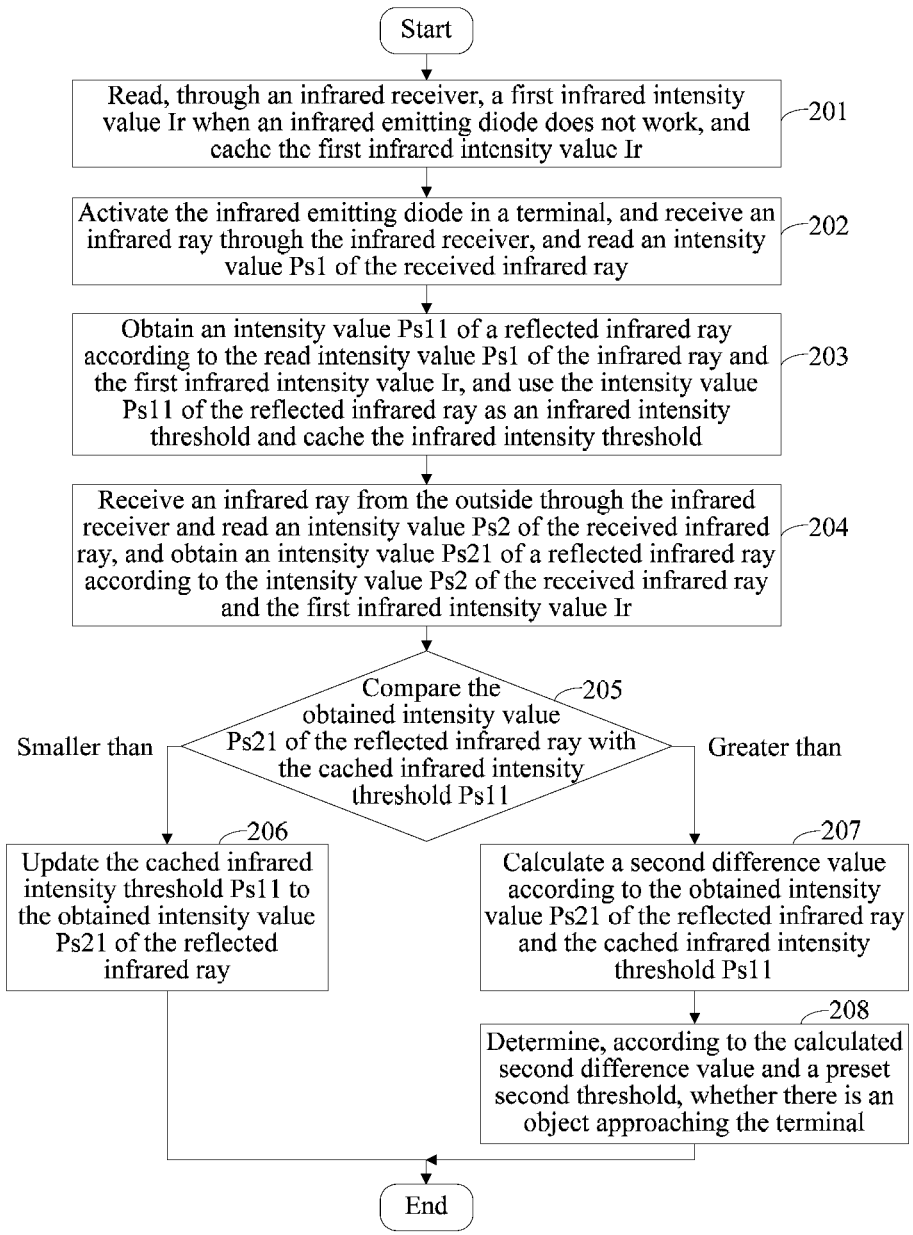
FIG. 2 is a flowchart of a method for a terminal to determine the approach of an object according to Embodiment 2 of the present invention.

An embodiment of the present invention provides a method for a terminal to determine whether an object is approaching. There is a proximity optical sensor formed of an infrared emitting diode and an infrared receiver in a terminal, and the terminal uses the method for determining approach of an object provided by this embodiment to determine whether there is an object approaching the terminal. Referring to FIG. 2, the method includes:

Step 201: Read, through an infrared receiver, a first infrared intensity value Ir when an infrared emitting diode does not work, and cache the first infrared intensity value Ir.

Specifically, the infrared emitting diode is stopped from working, and an infrared ray is received from outside through the infrared receiver, and the first infrared intensity value Ir of the received infrared ray is read, where the infrared ray received when the infrared emitting diode does not work is an infrared ray in the environment; therefore, the first infrared intensity value Ir is an intensity value of the infrared ray in the environment.

Step 202: Activate the infrared emitting diode in the terminal, receive an infrared ray through the infrared receiver and read an intensity value Ps1 of the received infrared ray.

After the infrared emitting diode in the terminal is activated, the infrared emitting diode emits an infrared ray to the outside in real time, and the infrared receiver in the terminal receives an infrared ray in real time, where the received infrared ray includes an infrared ray in the environment, and may further include an infrared ray which is reflected back and is of an infrared ray emitted by the infrared emitting diode to the outside. Therefore, the read intensity value Ps1 of the infrared ray received by the infrared receiver includes the first infrared intensity value Ir, and may further include an intensity value Ps11 of a reflected infrared ray.

The infrared emitting diode in the terminal emits an infrared ray to the outside, and a part of the emitted infrared ray is reflected back because of a factor such as the air, and are received by the infrared receiver in the terminal. If there is an object located in a direction in which the terminal emits an infrared ray, an infrared ray emitted by the infrared emitting diode is reflected back by the object and is received by the infrared receiver in the terminal. If the object located in the direction in which the terminal emits an infrared ray is closer to the terminal, intensity of the infrared ray which is received by the infrared receiver and is reflected by the object is stronger.

Step 203: Obtain an intensity value Ps11 of a reflected infrared ray according to the read intensity value Ps1 of the infrared ray and the first infrared intensity value Ir, and use the intensity value Ps11 of the reflected infrared ray as an infrared intensity threshold and cache the infrared intensity threshold.

Specifically, a first difference value Ps11 between the read intensity value Ps1 of the infrared ray and the first infrared intensity value Ir is calculated, and the first difference value Ps11 is equal to Ps1-Ir, where the calculated first difference value Ps11 is the intensity value of the reflected infrared ray, and the calculated first difference value Ps11 is used as the infrared intensity threshold. The infrared intensity threshold is cached.

The reflected infrared ray is received by the infrared receiver in the terminal after being blocked by a physical structure such as a screen of the terminal. Therefore, an impact generated because of the blocking by the physical structure of the terminal exists in the obtained first difference value, that is, the infrared intensity threshold.

The infrared emitting diode in the terminal emits an infrared ray to the outside in real time, and the infrared receiver in the terminal receives an infrared ray in real time, and when an infrared ray is received again, step 204 continues to be performed.

Step 204: Receive an infrared ray from the outside through the infrared receiver, and read an intensity value Ps2 of the received infrared ray, and obtain an intensity value Ps21 of a reflected infrared ray according to the intensity value Ps2 of the received infrared ray and the first infrared intensity value Ir.

Specifically, the infrared ray is received by the infrared receiver in the terminal, and the intensity value Ps2 of the received infrared ray is read, a first difference value Ps21 between the read intensity value Ps2 of the infrared ray and the first infrared intensity value Ir is calculated and the first difference value Ps21 is equal to Ps2-Ir, where the calculated first difference value Ps21 is the intensity value Ps21 of the reflected infrared ray.

An impact generated because of the physical structure of the terminal also exists in the obtained intensity value Ps21 of the reflected infrared ray; however, for a same terminal, an impact generated each time is the same.

Step 205: Compare the obtained intensity value Ps21 of the reflected infrared ray with the cached infrared intensity threshold Ps11, if the obtained intensity value Ps21 of the reflected infrared ray is smaller than the cached infrared intensity threshold Ps11, perform step 206, and if the obtained intensity value Ps21 of the reflected infrared ray is greater than the cached infrared intensity threshold Ps11, perform step 207.

Step 206: Update the cached infrared intensity threshold Ps11 to the obtained intensity value Ps21 of the reflected infrared ray, and end the operation.

Step 207: Calculate a second difference value according to the obtained intensity value Ps21 of the reflected infrared ray and the cached infrared intensity threshold Ps11.

An impact generated because of blocking of the physical structure of the terminal exists in the cached infrared intensity threshold Ps11, and an impact generated because of blocking of the physical structure of the terminal also exists in the obtained intensity value Ps21 of the reflected infrared ray; and because an impact generated each time is the same for the same terminal, the calculated second difference value Ps21-Ps11 eliminates an impact generated because of blocking of the physical structure of the terminal.

Step 208: Determine, according to the calculated second difference value and a preset second threshold, whether there is an object approaching the terminal.

Specifically, the calculated second difference value is compared with the preset second threshold, if the calculated second difference value exceeds the preset second threshold, it is determined that there is an object approaching the terminal; and if the calculated second difference value does not exceed the preset second threshold, it is determined that there is no object approaching the terminal.

When an object located in the direction in which the terminal emits an infrared ray is closer to the terminal, intensity of an infrared ray which is received by the infrared receiver in the terminal, is emitted by the infrared emitting diode and is reflected by the object is stronger, so that the calculated second difference value is greater, and when the calculated second difference value exceeds the preset second threshold, it may be determined that there is an object approaching the terminal.

The calculated second difference value eliminates an impact generated because of blocking of the physical structure of the terminal; and therefore, a same second threshold may be preset for each terminal, so as to determine whether there is an object approaching the terminal.

When the infrared receiver of the terminal receives an infrared ray from the outside again, step 204 is returned to and performed.

In this embodiment, step 205 and step 206 are optional steps, that is, after the proximity optical sensor is initially activated and caches the infrared intensity threshold for the first time in step 203, when an intensity value of a reflected infrared ray is obtained each time, a second difference value between the intensity value of the reflected infrared ray and the infrared intensity threshold cached for the first time may be directly obtained, and whether there is an object approaching the terminal may be determined according to the second difference value and the preset second threshold, so that step 205 and step 206 may not be performed.

In the embodiment of the present invention, the infrared intensity threshold is first obtained and cached, and then when an infrared ray is received from the outside each time, an intensity value of a reflected infrared ray is obtained, and if the intensity value of the reflected infrared ray is greater than the cached infrared intensity threshold, a second difference value between the intensity value of the reflected infrared ray and the cached infrared intensity threshold is calculated, and for the same terminal, an impact of the terminal on an intensity value of a reflected infrared ray received each time is the same; therefore, when the second difference value between the intensity value of the reflected infrared ray and the cached infrared intensity threshold is calculated, an impact of the physical structure of the terminal is eliminated, so that the same second threshold may be set for each terminal, and each terminal can accurately determine whether there is an object approaching.

Embodiment 3

Figure 3:
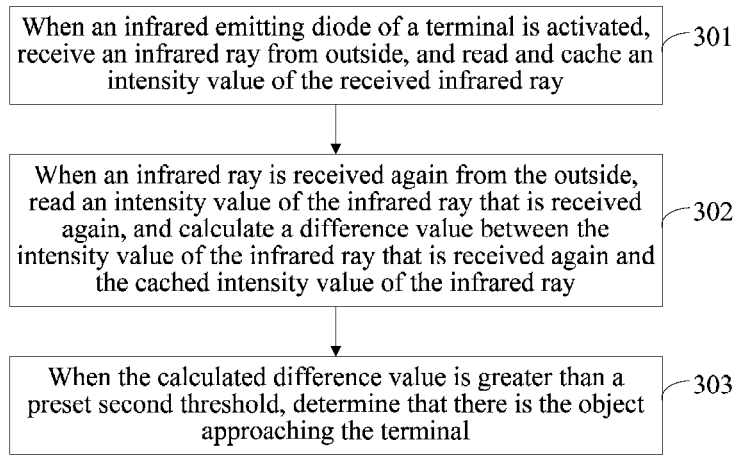
FIG. 3 is a flowchart of a method for a terminal to determine the approach of an object according to Embodiment 3 of the present invention.

As shown in FIG. 3, an embodiment of the present invention provides a method for a terminal to determine whether an object is approaching, where the method includes:

Step 301: When an infrared emitting diode of a terminal is activated, receive an infrared ray from outside, and read and cache an intensity value of the received infrared ray.

Step 302: When an infrared ray is received from the outside again, read an intensity value of the infrared ray that is received again, and calculate a difference value between the intensity value of the infrared ray that is received again and the cached intensity value of the infrared ray.

Step 303: When the calculated difference value is greater than a preset second threshold, determine that there is the object approaching the terminal.

In the embodiment of the present invention, the intensity value of the received infrared ray is first obtained and cached, and then when an infrared ray is received from the outside each time, an intensity value of the received infrared ray is read, a difference value is calculated according to the read intensity value of the infrared ray and the cached intensity value of the infrared ray, and whether there is an object approaching the terminal is determined according to the calculated difference value and the preset second threshold. For a same terminal, an impact of the terminal on an intensity value of a reflected infrared ray that is received each time is the same; therefore, when the difference value between the read intensity value of the infrared ray and the cached intensity value of the infrared ray is calculated, an impact of a physical structure of the terminal is eliminated, so that a same second threshold may be set for each terminal, and each terminal can accurately determine whether there is an object approaching.

Embodiment 4

Figure 4:
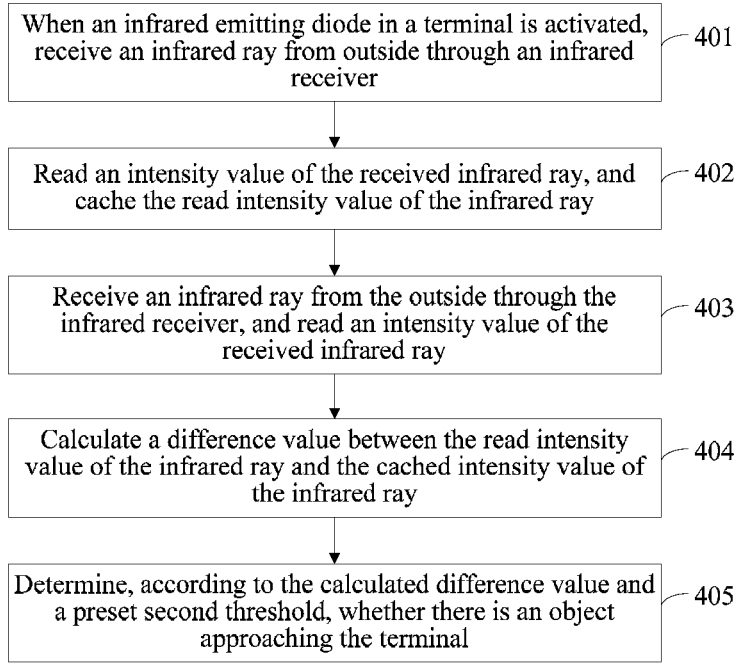
FIG. 4 is a flowchart of a method for a terminal to determine the approach of an object according to Embodiment 4 of the present invention.

An embodiment of the present invention provides a method for a terminal to determine whether an object is approaching. There are an infrared emitting diode and an infrared receiver in a terminal, and the terminal uses the method for determining whether an object is approaching provided by this embodiment to determine whether there is an object approaching the terminal. Referring to FIG. 4, the method includes:

Step 401: When an infrared emitting diode in the terminal is activated, receive an infrared ray from outside through an infrared receiver.

When the infrared emitting diode is activated, the infrared emitting diode emits an infrared ray to the outside, and a part of emitted infrared rays are reflected back by a substance such as the air; and in addition, an infrared ray also exists in the environment; therefore, the infrared ray received by the infrared receiver includes an infrared ray in the environment and a reflected infrared ray.

Step 402: Read an intensity value of the received infrared ray, and cache the read intensity value of the infrared ray.

The received infrared ray includes an infrared ray in the environment and a reflected infrared ray; therefore, the read intensity value of the infrared ray includes an intensity value of the reflected infrared ray and an intensity value of the infrared ray in the environment.

The reflected infrared ray is received by the infrared receiver in the terminal after being blocked by a physical structure such as a screen of the terminal; therefore, an impact generated because of blocking of the physical structure of the terminal exists in the read intensity value of the reflected infrared ray.

The infrared emitting diode in the terminal emits an infrared ray to the outside in real time, and the infrared receiver in the terminal receives an infrared ray in real time, and when an infrared ray is received again, step 403 is performed.

Step 403: Receive an infrared ray from the outside through the infrared receiver, and read an intensity value of the received infrared ray.

The received infrared ray includes an infrared ray in the environment and a reflected infrared ray; therefore, the intensity value which is of the infrared ray and is read this time includes an intensity value of the reflected infrared ray and an intensity value of the infrared ray in the environment. In addition, intensity of an infrared ray in the environment is stable; therefore, an intensity value which is of an infrared ray in the environment and is included in an intensity value which is of an infrared ray and is read each time is the same.

The reflected infrared ray is received by the infrared receiver in the terminal after being blocked by a physical structure such as a screen of the terminal; therefore, an impact generated because of blocking of the physical structure of the terminal also exists in the read intensity value of the reflected infrared ray.

Step 404: Calculate a difference value between the read intensity value of the infrared ray and the cached intensity value of the infrared ray.

An intensity value which is of an infrared ray in the environment and is included in an intensity value which is of an infrared ray and is read each time is the same; therefore, a difference operation is performed on the read intensity value of the infrared ray and the cached intensity value of the infrared ray, and the obtained difference value is an intensity difference value of the reflected infrared ray.

For a same terminal, an impact of the physical structure of the terminal on a reflected infrared ray that is received each time is the same and an intensity value which is of an infrared ray in the environment and is read each time is also the same; therefore, a difference operation is performed on the read intensity value of the infrared ray and the cached intensity value of the infrared ray, so that an impact of the terminal and the intensity value of the infrared ray in the environment may be eliminated.

Step 405: Determine, according to the calculated difference value and a preset second threshold, whether there is an object approaching the terminal.

Specifically, whether the calculated difference value exceeds the preset second threshold is determined, if yes, it is determined that there is an object approaching the terminal, and if no, it is determined that there is no object approaching the terminal.

When the difference value between the read intensity value of the infrared ray and the cached intensity value of the infrared ray is calculated, an impact generated by the physical structure of the terminal is eliminated; therefore, a same second threshold may be preset for each terminal, so as to determine whether there is an object approaching the terminal.

When the infrared receiver in the terminal receives an infrared ray from the outside again, step 403 is returned to and performed.

In the embodiment of the present invention, the intensity value of the received infrared ray is first obtained and cached, and then when an infrared ray is received from the outside each time, an intensity value of the received infrared ray is read, a difference value is calculated according to the read intensity value of the infrared ray and the cached intensity value of the infrared ray, and whether there is an object approaching the terminal is determined according to the calculated difference value and the preset second threshold. For the same terminal, an impact of the terminal on an intensity value of a reflected infrared ray that is received each time is the same; therefore, when the difference value between the read intensity value of the infrared ray and the cached intensity value of the infrared ray is calculated, an impact of a physical structure of the terminal is eliminated, so that the same second threshold may be set for each terminal, and each terminal can accurately determine whether there is an object approaching.

Embodiment 5

Figure 5:
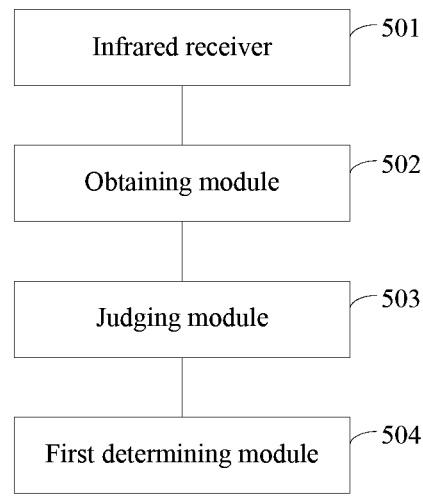
FIG. 5 is a schematic diagram of an apparatus for a terminal to determine the approach of an object according to Embodiment 5 of the present invention.

As shown in FIG. 5, an embodiment of the present invention provides an apparatus for a terminal to determine whether an object is approaching, where the apparatus includes: an infrared receiver 501, configured to read a first infrared intensity value when an infrared emitting diode does not work, and read a second infrared intensity value when the infrared emitting diode works; an obtaining module 502, configured to obtain a first difference value between the second infrared intensity value and the first infrared intensity value as an intensity value of a reflected infrared ray; a judging module 503, configured to determine whether a second difference value between the intensity value of the reflected infrared ray and an infrared intensity threshold that is stored by the terminal itself is greater than a preset second threshold; and a first determining module 504, configured to, when the second difference value is greater than the preset second threshold, determine that there is the object approaching the terminal.

Furthermore, the apparatus further includes: a comparing module, configured to compare the intensity value of the reflected infrared ray and the infrared intensity threshold that is stored by the terminal, and when the intensity value of the reflected infrared ray is smaller than the stored infrared intensity threshold, replace the stored infrared intensity threshold with the intensity value of the reflected infrared ray as a new infrared intensity threshold and save the new infrared intensity threshold in the terminal.

The stored infrared intensity threshold is the first difference value which is between the second infrared intensity value and the first infrared intensity value and is obtained when a proximity optical sensor is initially activated.

In the embodiment of the present invention, the intensity value of the received infrared ray is first obtained and cached, and then when an infrared ray is received from the outside each time, an intensity value of the received infrared ray is read, a difference value is calculated according to the read intensity value of the infrared ray and the cached intensity value of the infrared ray, and whether there is an object approaching the terminal is determined according to the calculated difference value and the preset second threshold. For a same terminal, an impact of the terminal on an intensity value of a reflected infrared ray that is received each time is the same; therefore, when the difference value between the read intensity value of the infrared ray and the cached intensity value of the infrared ray is calculated, an impact of a physical structure of the terminal is eliminated, so that a same second threshold may be set for each terminal, and each terminal can accurately determine whether there is an object approaching.

Embodiment 6

Figure 6:
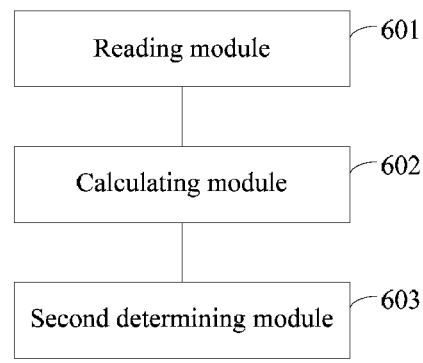
FIG. 6 is a schematic diagram of an apparatus for a terminal to determine the approach of an object according to Embodiment 6 of the present invention.

As shown in FIG. 6, an embodiment of the present invention provides an apparatus for a terminal to determine whether an object is approaching, where the apparatus includes: a reading module 601, configured to, when an infrared emitting diode of the terminal is activated, receive an infrared ray from outside, and read and cache an intensity value of the received infrared ray; a calculating module 602, configured to, when an infrared ray is received from the outside again, read an intensity value of the received infrared ray, and calculate a difference value between the intensity value of the received infrared ray and the cached intensity value of the infrared ray; and a second determining module 603, configured to, when the calculated difference value is greater than a preset second threshold, determine that there is the object approaching the terminal.

In the embodiment of the present invention, the intensity value of the received infrared ray is first obtained and cached, and then when an infrared ray is received from the outside each time, an intensity value of the received infrared ray is read, a difference value is calculated according to the read intensity value of the infrared ray and the cached intensity value of the infrared ray, and whether there is an object approaching the terminal is determined according to the calculated difference value and the preset second threshold. For a same terminal, an impact of the terminal on an intensity value of a reflected infrared ray that is received each time is the same; therefore, when the difference value between the read intensity value of the infrared ray and the cached intensity value of the infrared ray is calculated, an impact of a physical structure of the terminal is eliminated, so that a same second threshold may be set for each terminal, and each terminal can accurately determine whether there is an object approaching.

It should be noted that, the apparatus for a terminal to determine whether an object is approaching in Embodiment 5 and Embodiment 6 may be a mobile phone, an E-book, a personal digital assistant (PDA, personal digital assistant), a palmtop computer, a human-machine interaction terminal, or another hand-held terminal device having a display function. In the embodiments of the present invention, when the apparatus is a mobile phone, the mobile phone may further include: a case, a circuit board, a processor, a touchscreen, an infrared proximity sensor, a radio frequency circuit, a microphone, a loudspeaker, and a power supply, where the touchscreen is placed on the case, the infrared proximity sensor is disposed under the touchscreen, the circuit board is placed in a space enclosed by the case, and the processor and the radio frequency circuit are disposed on the circuit board; the processor includes all or a part of the modules or units, and the processor is configured to process data input through the touchscreen or the infrared proximity sensor, and/or output a result of the processed data through the touchscreen; the radio frequency circuit is configured to establish communication between the mobile phone and a wireless network, so as to implement data receiving and sending between the mobile phone and the wireless network; the microphone is configured to collect sound and convert the collected sound into sound data, so that the mobile phone sends the sound data to the wireless network through the radio frequency circuit; the loudspeaker is configured to restore sound data received by the mobile phone from the wireless network through the radio frequency circuit to sound and play the sound for a user; and the power supply is configured to supply power to each circuit or device of the mobile phone.

Persons of ordinary skill in the art may understand that all or a part of the steps of the foregoing embodiments may be implemented through hardware, and may also be implemented by a program instructing relevant hardware. The program may be stored in a computer readable storage medium. The storage medium may be a read-only memory, a magnetic disk, or an optical disk, or the like.

The foregoing description is merely exemplary embodiments of the present invention, but is not intended to limit the present invention. Any modification, equivalent replacement, or improvement made within the spirit and principle of the present invention shall fall within the protection scope of the present invention.

What is claimed is:

1. A method, executed by a terminal, for determining whether an object is approaching, comprising:
   reading, by an infrared receiver, a first infrared intensity value when an infrared emitting diode is off;
   reading, by the infrared receiver, a second infrared intensity value when the infrared emitting diode is on;
   obtaining, for an intensity value of a reflected infrared ray, a first difference value between the second infrared intensity value and the first infrared intensity value;
   determining whether a second difference value between the intensity value of the reflected infrared ray and an infrared intensity threshold that is stored by the terminal itself is greater than a preset second threshold; and
   when the second difference value is greater than the preset second threshold, determining that an object is approaching the terminal;
   wherein the stored infrared intensity threshold is the first difference value between the second infrared intensity value and the first infrared intensity value and is obtained when the infrared receiver and the infrared emitting diode are initially activated.

2. The method according to claim 1, further comprising:
   comparing the intensity value of the reflected infrared ray and the infrared intensity threshold that is stored by the terminal; and when the intensity value of the reflected infrared ray is smaller than the stored infrared intensity threshold, replacing the stored infrared intensity threshold with the intensity value of the reflected infrared ray as a new infrared intensity threshold, and saving the new infrared intensity threshold at the terminal.

3. A non-transitory computer readable medium including computer-executable instructions for execution on a terminal, which is configured to determine whether an object is approaching, such that when the computer-executable instructions are executed by the terminal a method is carried out comprising:

reading a first infrared intensity value when an infrared emitting diode is off and reading a second infrared intensity value when the infrared emitting diode is on;

obtaining a first difference value between the second infrared intensity value and the first infrared intensity value as an intensity value of a reflected infrared ray;

determining whether a second difference value between the intensity value of a reflected infrared ray and an infrared intensity threshold that is stored by the terminal itself is greater than a preset second threshold; and determining when the second difference value is greater than the preset second threshold, that there is an object approaching the terminal;

wherein the stored infrared intensity threshold is the first difference value between the second infrared intensity value and the first infrared intensity value and is obtained during initial activation.

4. A non-transitory computer readable medium including computer-executable instructions for execution on a terminal, which is configured to determine whether an object is approaching, such that when the computer-executable instructions are executed by the terminal a method is carried out comprising:

reading when an infrared emitting diode of the terminal is activated an intensity value of a received infrared ray;

caching the intensity value of the received infrared ray;

reading when an additional infrared ray is received from the outside an intensity value of the additional infrared ray;

calculating a difference value between the intensity value of the additional infrared ray and the cached intensity value; and determining, when the calculated difference value is greater than a preset threshold, that an object is approaching the terminal;

wherein the stored infrared intensity threshold is the first difference value between the second infrared intensity value and the first infrared intensity value and is obtained during initial activation.

* * * * *